(12) United States Patent
Tokano et al.

(10) Patent No.: US 7,488,993 B2
(45) Date of Patent: Feb. 10, 2009

(54) SEMICONDUCTOR DEVICE AND METHOD OF MANUFACTURING THE SAME

(75) Inventors: Kenichi Tokano, Kanagawa (JP);
Motoshige Kobayashi, Kanagawa (JP);
Kazuyuki Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 11/067,627

(22) Filed: Feb. 28, 2005

(65) Prior Publication Data

US 2005/0208738 A1 Sep. 22, 2005

(30) Foreign Application Priority Data

Mar. 17, 2004 (JP) ............... 2004-076631

(51) Int. Cl.
*H01L 29/51* (2006.01)

(52) U.S. Cl. ............... 257/164; 257/165; 257/197; 257/273; 257/565

(58) Field of Classification Search ............... 257/164, 257/165, 197, 273, 565
See application file for complete search history.

(56) References Cited

U.S. PATENT DOCUMENTS 5,742,468 A * 4/1998 Matsumoto et al. ......... 361/229
6,476,501 B1 * 11/2002 Ohuchi et al. ............... 257/778
6,689,639 B2 * 2/2004 Sakuyama et al. .......... 438/118
6,841,862 B2 * 1/2005 Kikuchi et al. ............... 257/680
7,129,110 B1 * 10/2006 Shibata ........................ 438/106

FOREIGN PATENT DOCUMENTS

| JP | 9-64049 | | 3/1997 |
| JP | 411340270 A | * | 12/1999 |
| JP | 2002-100589 | | 4/2002 |

* cited by examiner

*Primary Examiner*—Zandra Smith
*Assistant Examiner*—Khanh B. Duong
(74) *Attorney, Agent, or Firm*—Oblon, Spivak, McClelland, Maier & Neustadt, P.C.

(57) ABSTRACT

A semiconductor device, includes: a semiconductor substrate of 100 micrometers or less in thickness; an electrode pattern formed above the semiconductor substrate; and an insulation film of 50 micrometers or greater in thickness residing on parts of the upper surface side of the semiconductor substrate other than at least on the electrode pattern. And a method of manufacturing a semiconductor device, includes: forming elements on a semiconductor substrate; forming electrodes in a predetermined part on the elements; affixing an insulator sheet of 50 micrometers or greater in thickness to the upper surface side of the semiconductor substrate, the insulator sheet being processed to remove some parts so as to be aligned with the electrodes or regions where the elements are provided, processing a back surface side of the semiconductor substrate affixed within the insulator sheet to form the semiconductor substrate of 100 micrometers or lower in thickness, and dicing the semiconductor substrate into semiconductor chips.

15 Claims, 7 Drawing Sheets

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2004-076631, filed on Mar. 17, 2004; the entire contents of which are incorporated herein by reference.

BACKGROUND OF THE INVENTION

The present invention relates to a semiconductor device and a method of manufacturing the same, and more particularly, it relates to a semiconductor device capable of having a wafer of reduced thickness by virtue of reinforcement and a method of manufacturing such a semiconductor device.

A semiconductor device typically uses a wafer of silicon or other material, and various elements, interconnections, electrodes, and the like are integrally formed thereon through a wafer process. Especially, it is known in the art that a device such as an IGBT (Insulated Gate Bipolar Transistor) dedicated to a switching device exhibits enhanced device performance, including a reduced turn-on voltage and a decreased switching loss, by reducing a thickness of its substrate.

Because of this teaching, wafers conventionally used in semiconductor devices have a thickness of 110 to 120 micrometers. But recently, even thinner wafers having a thickness of 100 micrometers or thinner have begun to be used.

With such semiconductor wafers of reduced thickness, however, semiconductor devices, while undergoing an ordinary semiconductor manufacturing process, may become defective, with cracks or chippings in the wafer due to its insufficient strength, which eventually reduces yields of the device products.

In another approach, the wafer process is performed with a relatively thick wafer and the wafer has its back surface ground and thinned immediately before the dicing. However, the thinned wafer may sometimes be warped due to stress which is generated through different coefficients of thermal expansion between the wafer and a passivation film formed at the final stage of a wafer process.

For grinding the back surface of the wafer, various approaches have been proposed as in Patent Document 1 (Japanese Patent Laid-open No. Hei9-64049(1997)) which discloses a resin reinforcing layer applied on the wafer surface, and as in Patent Document 2 (Japanese Patent Laid-open 2002-100589) which discloses surface protection adhesive tape applied on the wafer surface. Also, in order to avoid the cracking and chipping, manufacturing machines have been frequently improved to attain delicate handling of the wafer.

Such improvements of the manufacturing machine, however, lead to a cost increase in the machines and a degraded workability, and ultimately to a cost increase in the products.

SUMMARY OF THE INVENTION

According to the first aspect of the present invention, there is provided a semiconductor device, comprising:

a semiconductor substrate of 100 micrometers or less in thickness;

an electrode pattern formed above the semiconductor substrate; and an insulation film of 50 micrometers or greater in thickness residing on parts of the upper surface side of the semiconductor substrate other than at least on the electrode pattern.

According to the second aspect of the present invention, there is provided a method of manufacturing a semiconductor device, comprising:

forming elements on a semiconductor substrate;

forming electrodes in a predetermined part on the elements;

affixing an insulator sheet of 50 micrometers or greater in thickness to the upper surface side of the semiconductor substrate, the insulator sheet being processed to remove some parts so as to be aligned with the electrodes or regions where the elements are provided, processing a back surface side of the semiconductor substrate affixed within the insulator sheet to form the semiconductor substrate of 100 micrometers or lower in thickness, and dicing the semiconductor substrate into semiconductor chips.

According to the third aspect of the present invention, there is provided a emiconductor device manufactured by a process comprising:

forming elements on a semiconductor substrate;

forming electrodes in a predetermined part on the elements;

affixing an insulator sheet of 50 micrometers or greater in thickness to the upper surface side of the semiconductor substrate, the insulator sheet being processed to remove some parts so as to be aligned with the electrodes or regions where the elements are provided, processing a back surface side of the semiconductor substrate affixed with the insulator sheet to form the semiconductor substrate of 100 micrometers or lower in thickness, and dicing the semiconductor substrate into semiconductor chips.

DETAILED DESCRIPTION OF THE INVENTION

Some embodiments of the present invention will now be described in detail in conjunction with the accompanying drawings, which are schematically depicted by way of examples and are not scaled precisely.

Figure 1:
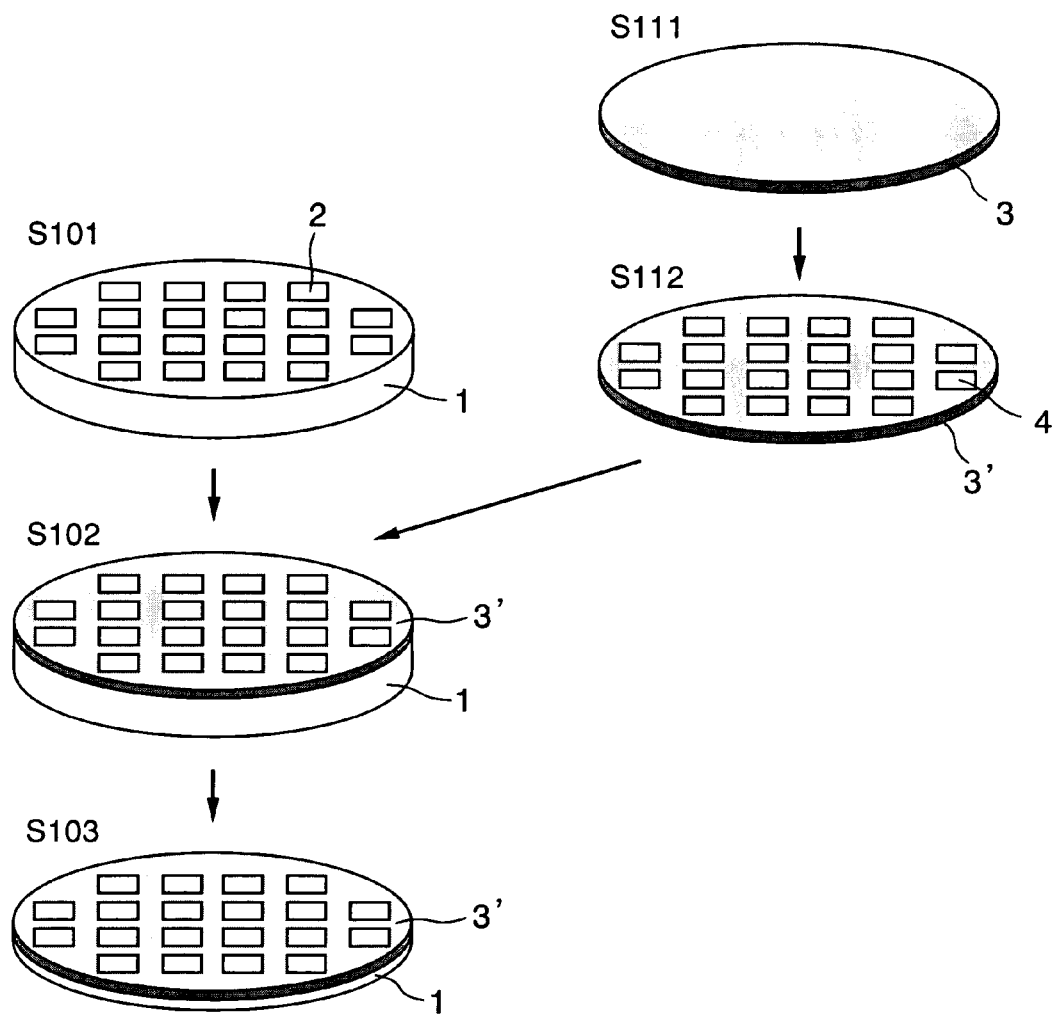
FIG. 1 shows a schematic flow of a manufacturing method of a semiconductor device according to one embodiment of the present invention.

FIG. 1 is a diagram illustrating a manufacturing method of a semiconductor device according to an embodiment of the present invention.

First, a wafer 1 of about 300 micrometers in thickness is prepared, and after the wafer 1 undergoes a predetermined wafer process to form elements therein, an aluminum layer 2 is deposited thereon to finally serve as electrodes (step S101). In such a case, a surface area between the electrodes is provided with a passivation film of a substance such as polyimide, which is typically 5 to 10 micrometers in thickness.

Then, a polyimide sheet 3 of 100 micrometers in thickness, serving as an insulator sheet, is prepared (step S111). Subsequent to this, the polyimide sheet is punch-pressed to remove the parts corresponding to the aluminum layer to obtain a patterned polyimide sheet 3' (step S112).

Figure 2:
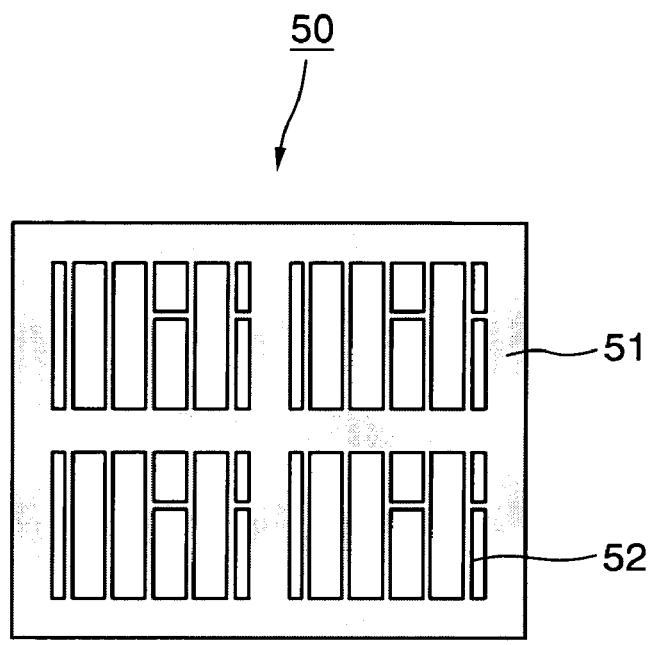
FIG. 2 is a plan view showing an insulator sheet used in the embodiment of the present invention, a part of the sheet removed in a pattern corresponding to electrodes disposed in the semiconductor device.
Figure 3:
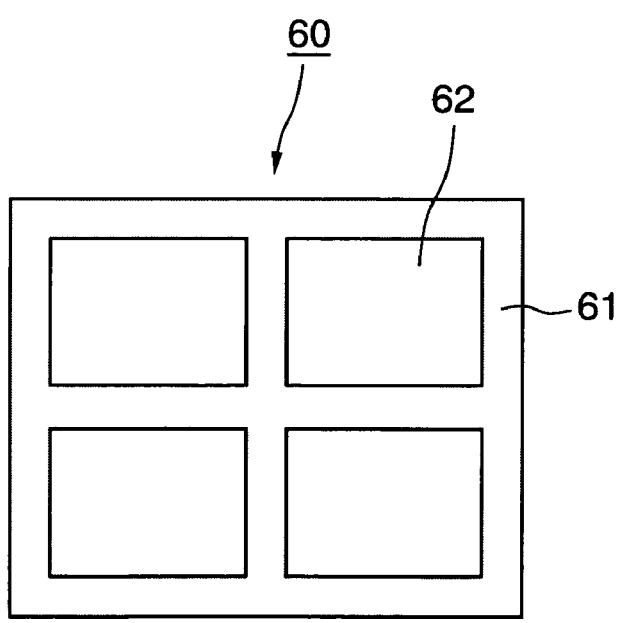
FIG. 3 is a plan view showing an insulator sheet used in the embodiment of the present invention, a part of the sheet removed in a pattern corresponding to a device forming region disposed in the semiconductor device.

The polyimide sheet may be varied in size to have masks for a larger chip as in FIG. 2 and for a smaller chip as in FIG. 3, respectively. These figures illustrate parts that would be four separate device forming regions although they are scaled differently from each other.

A polyimide sheet pattern 50 for the larger chip in FIG. 2 defines a square device forming region of approximately 14 mm in each side and includes separate patterned segments, namely patterned segments 51 which correspond to outside part of the device forming regions and patterned segments 52 which correspond to the passivation polyimide film provided between the aluminum electrodes within the device forming region.

In contrast, a polyimide sheet pattern 60 for the smaller chip in FIG. 3 defines a square device forming region of approximately 5 mm in each side and includes only patterned segments 52 which correspond to an outside part of the device forming region and no patterned segment is provided within the part 62 which corresponds to the device forming region.

Although some representative polyimide sheet patterns are disclosed in the context of this embodiment, it should be appreciated that such patterns depend upon several factors of the polyimide sheet such as a scale of the integration of the chip affixed with the sheet, its dimensions and the like. The punch-pressing to remove a part of the polyimide sheet can be applied to a case in which it is desired that the residual segment resulted from the patterning is 0.5 mm or more in width or in distance from one segment to another.

It is desirable that heat resistance of the polyimide sheet is continually 400 degree centigrade or even higher so as not to be sensitive to any influence of heat that may be applied during the succeeding process. With the heat resistance of 400 degree centigrade or above, a subsequent temporary heating condition may be considerably high in temperature during the thermo-compression bonding which will be described later so as to enhance a reinforcing effect.

Processes and treatments for the polyimide sheet may include the etching with organic alkaline liquid etchant such as an aqueous solution of tetramethyl ammonium hydroxide and the laser cutting as well as the punch-pressing as mentioned above, and one of them is selected depending upon accuracy of the desired pattern and so forth.

Next, the processed polyimide sheet is placed in position over the wafer 1 so that removed parts 4 punched out of the sheet are aligned with the predetermined patterns for both the device forming regions and the electrodes, and thereafter, the sheet is thermo-compressively affixed to the wafer (step S102). The thermo-compression bonding is carried out at a temperature at 300 to 450 degree centigrade, with a load of 10 kgf, and duration of 10 minutes. This enables the wafer 1 to be securely reinforced by the polyimide sheet 3'. The secure bonding of the insulator sheet to the substrate surface may be by means of adhesive other than the thermo-compressive bonding.

The back surface of the substrate (the opposite side to the polyimide sheet 3') is ground and chemically etched to reduce the thickness of the substrate as thin as 100 micrometers or below (step S103). Because of the reinforcement by the polyimide sheet 3', the resultant product would have no crack or chipping in its silicon (Si) substrate. The thinning of the substrate sometimes causes warping which would never occur prior to grinding due to the hardness of a substrate of full thickness. With the insulator sheet affixed, however, to the upper surface of the substrate as in this embodiment of the present invention, the warping in the substrate can be suppressed.

With reference to FIGS. 4 to 11, the bonding status of the polyimide sheet will be described in more detail below.

Figure 4:
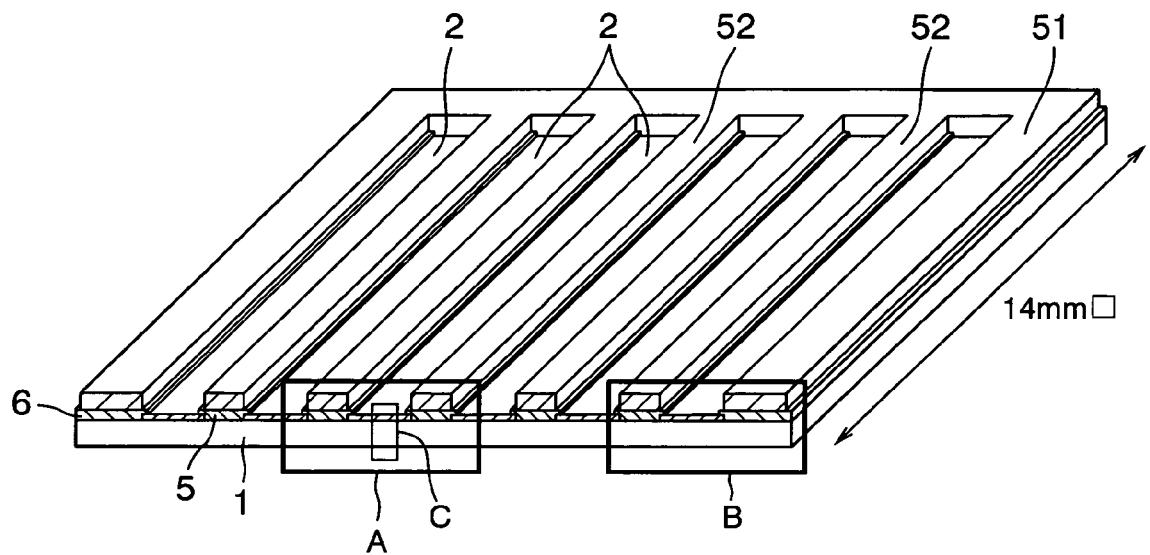
FIG. 4 is a perspective view showing the insulator sheet in FIG. 2 attached onto a chip for patterning.
Figure 5A:
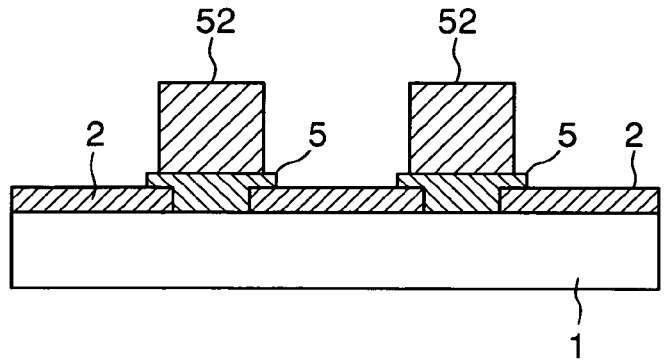
FIGS. 5A and 5B are enlarged cross-sectional views of parts denoted as A and B in FIG. 4.
Figure 5B:
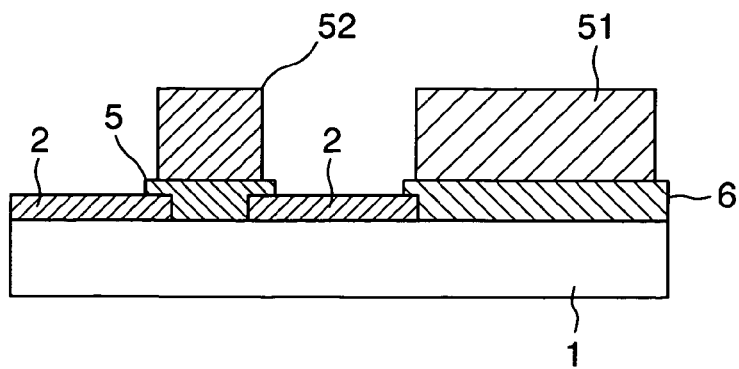

FIG. 4 shows a single relatively large chip of 14 mm in each side having the patterned polyimide sheet in FIG. 2 affixed thereto while FIGS. 5A and 5B are enlarged cross-sectional views showing parts denoted as A and B parts in FIG. 4.

In the surface of the silicon wafer, aluminum electrodes 2 are placed in parallel to each other and separated a predetermined distance from each other, defining stripe-shaped elongated gaps between the adjacent ones, and the gaps defined by the electrodes 2 are filled with insulator to form an insulating passivation film 5 which has its top surface elevated higher than the upper surface of each of the electrodes 2, while edges of the gaps laterally spread over the electrodes 2 adjacent thereto to shape "overhangs". In contrast, in the periphery of the chip, a passivation film 6 greater in width than the gaps is formed to encircle the whole device forming regions.

Among the aluminum electrodes 2 shown in FIG. 4, only shorter ones are connected to gates while the remaining are all connected to the emitters (or otherwise connected to sources in a MOSFET).

The polyimide sheet pattern 50 shown in FIG. 2 is laid over and fixed to the passivation films 5 and 6 where the patterned segment 52 of the polyimide sheet pattern 50 resides on the passivation film 5 within the device forming region while the patterned segment 51 resides on the passivation film 6 outside the device forming regions.

In FIG. 4, components, such as a diffusion layers unique to each semiconductor device, which are built in the substrate are omitted, but instead, an enlarged cross-section of the configuration of the part denoted as C in FIG. 4 is depicted in detail in FIGS. 6 to 9, respectively.

Figure 6:
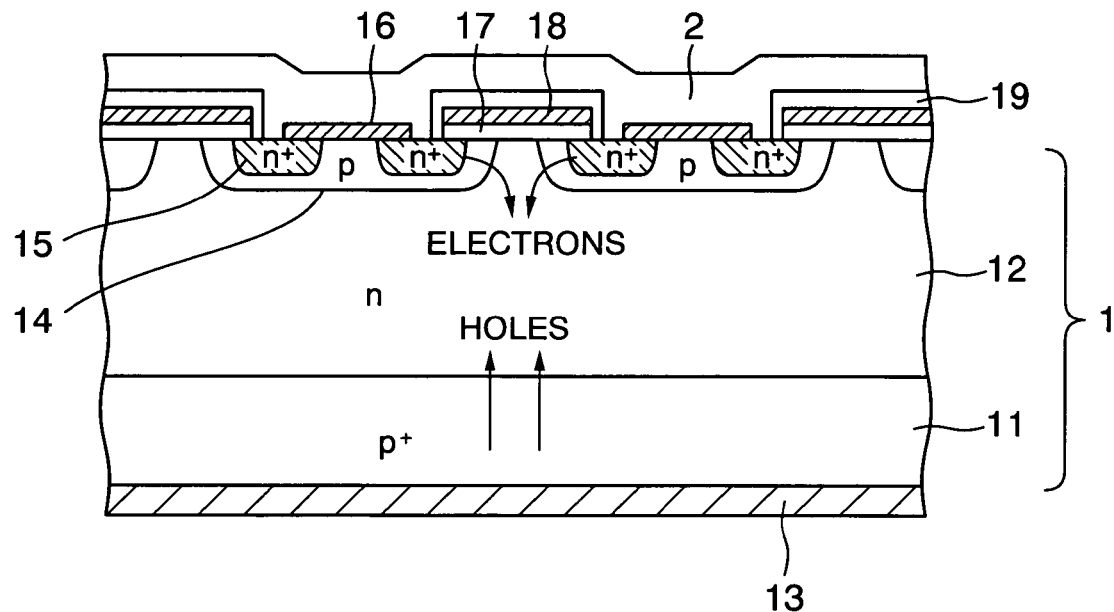
FIG. 6 is an enlarged cross-sectional view illustrating a part of the device denoted as C in FIG. 4 as an exemplary non-punch-through type IGBT.

First, FIG. 6 is a vertical sectional view of a non-punch-through IGBT structure.

A substrate 1 is of $p^+/n$ stacked structure having a lower $p^+$ layer 11 underlying an upper n layer 12, and it is provided with $n^+$ regions 15 defined in a p well 14 in the upper surface of the substrate to serve as an emitter region, a gate electrode 18 formed over the upper surface of the substrate between two of the p wells 14, with a gate insulation film 17 being interposed therebetween, an emitter electrode 16 extending from the adjacent emitter regions to bridge the upper surface of the substrate, and a collector electrode 13 placed over the p layer on a back surface of the substrate.

The entire surface of the device structure is covered with the aluminum layer 2, and the gate electrode 18 is coated with an insulation film 19 of glass material to insulate the emitter electrode 16 from the gate electrode 18.

Figure 7:
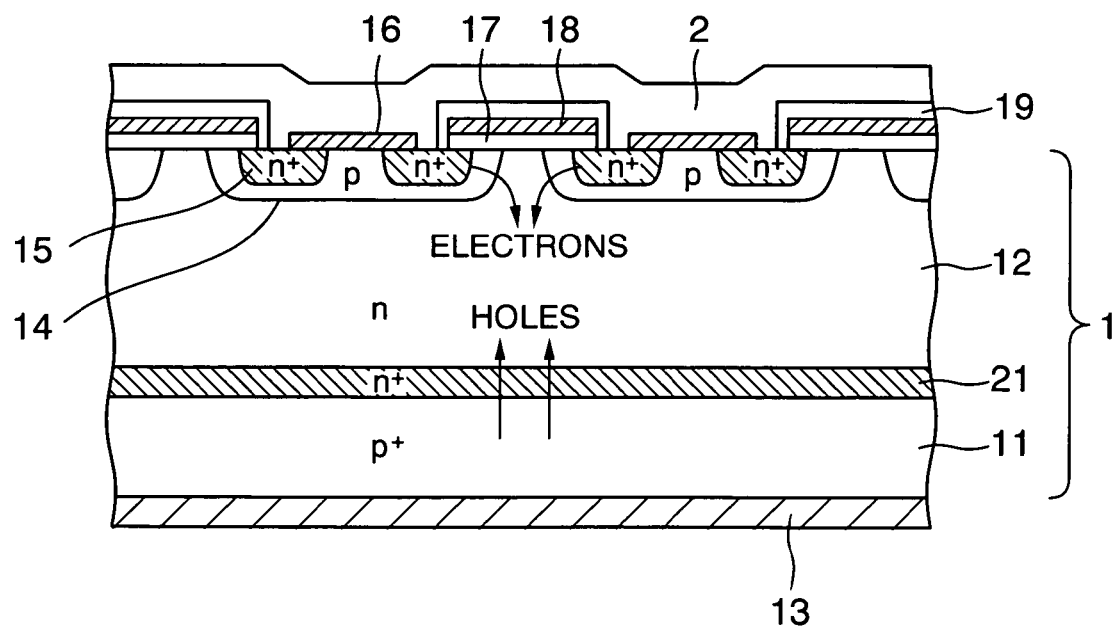
FIG. 7 is an enlarged cross-sectional view illustrating a part of the device denoted as C in FIG. 4 as an exemplary punch-through type IGBT.

FIG. 7 is an enlarged cross-sectional view showing a punch-through IGBT structure having a device structure similar to that in FIG. 6. The difference between structures in FIG. 6 and FIG. 7 is that the substrate 1 is of $p^+/n^+/n$ stacked structure having an embedded $n^+$ layer 21 between the $p^+$ layer 11 and the n layer 12.

Figure 8:
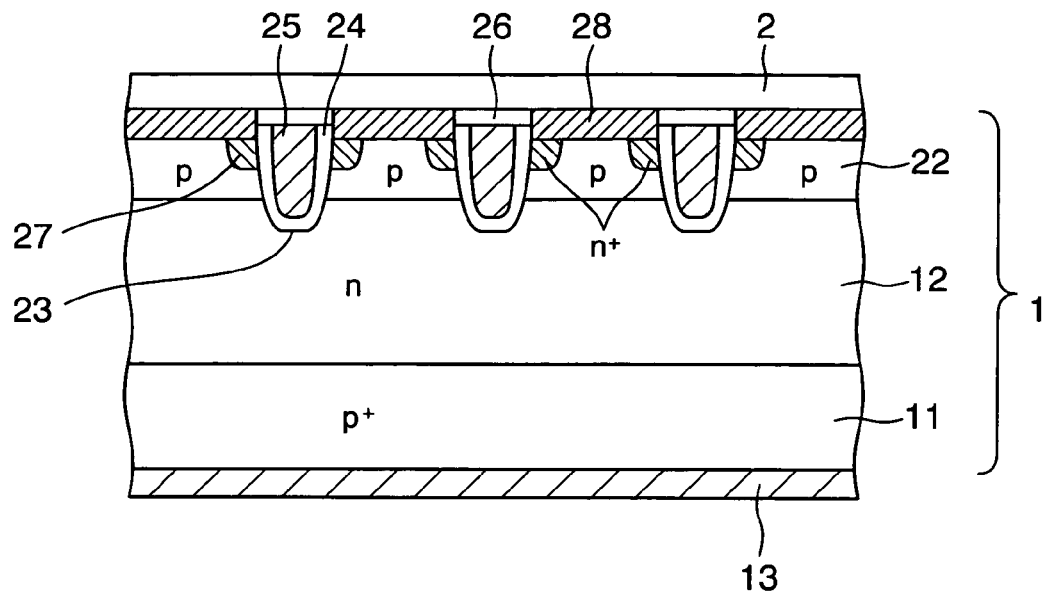
FIG. 8 is an enlarged cross-sectional view showing a part of the device denoted as C in FIG. 4 as an exemplary trench gate type IGBT.

FIG. 8 shows exemplary trench gate type IGBT. This IGBT in FIG. 8 is of a structure where the stacking of the $p^+$ layer 11 and the n layer 12 overlying the substrate is further overlaid with a p layer 22, and the multi-layer structure is provided with a trench gate which is defined as a trench 23 extending from the surface of the substrate to the n layer 12, having its inner walls covered with an insulation film 23, and filled with the insulator material 25. This isolates the p layer 22 and permits wells to he shaped therein, and an $n^+$ region 27 is formed in the surface of the isolated p layer 22. On the entire surface of the substrate, the aluminum layer 2 is deposited, connecting the emitter electrode 28, and an insulation layer 26 is embedded at upper part of the trench gate in the trench 23 to isolate the trench gate from the emitter electrode 28.

Figure 9:
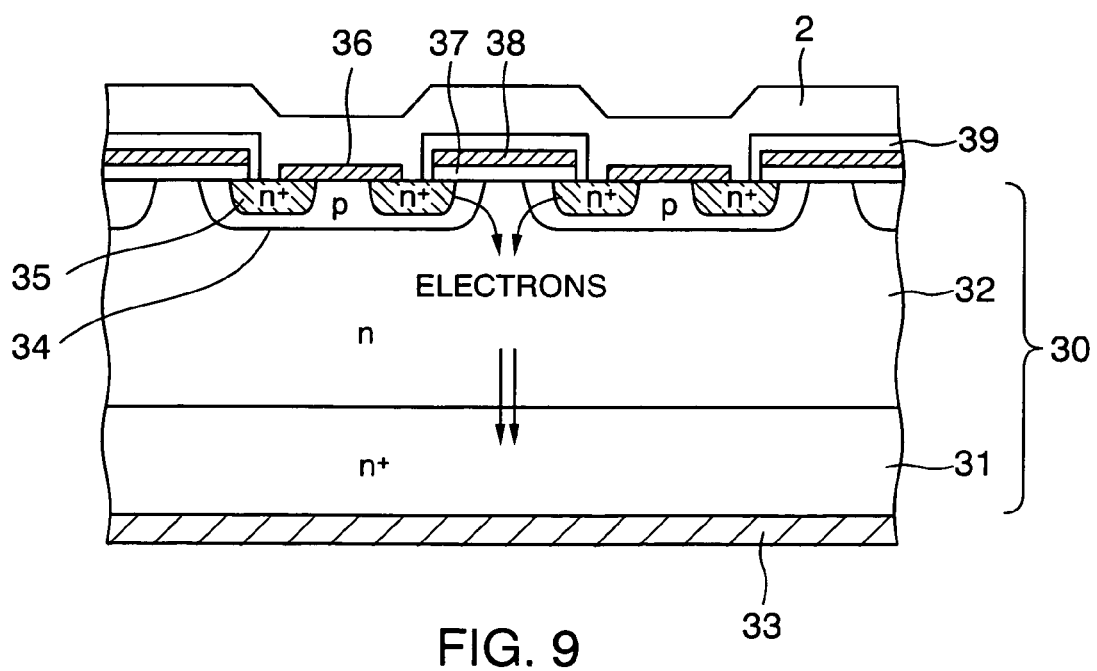
FIG. 9 is an enlarged cross-sectional view showing a part of the device denoted as C in FIG. 4 as an exemplary vertical type MOSFET.

FIG. 9 is a cross-sectional view showing a basic structure of a vertical MOSFET.

A substrate 30 employs an $n^+/n$ stacking structure where an $n^+$ layer 31 and an n layer 32 are laid one over another, and it is provided with $n^+$ regions 35 formed in a p well 34 in the upper surface of the substrate to serve as a source region, a gate electrode 38 deposited between adjacent p wells in the upper surface of the substrate, with a gate insulation film 37 interposed therebetween, a source electrode 36 extending from the adjacent source regions 35 in the upper surface of the substrate, and a drain electrode 33 provided over the $n^+$ layer 31 on a back surface of the substrate.

Although the entire surface of such device structure is generally overlaid with the aluminum layer 2, the gate electrode 33 is covered with an insulation film 39 of glass material to insulate the source electrode 36 from the gate electrode 38.

Figure 10:
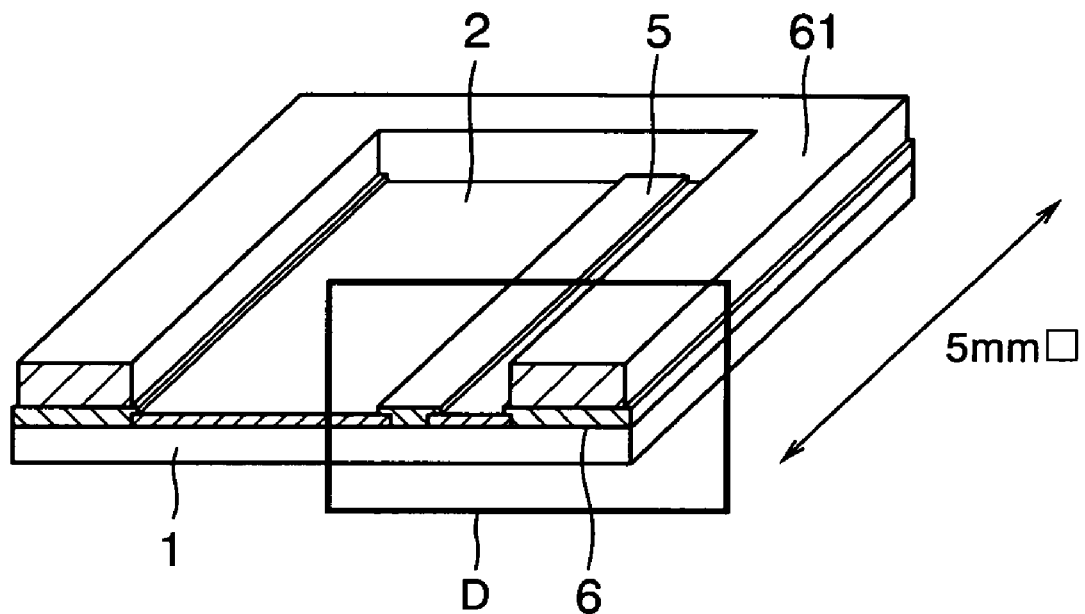
FIG. 10 is a perspective view showing the insulator sheet in FIG. 3 attached onto the chip for patterning.
Figure 11:
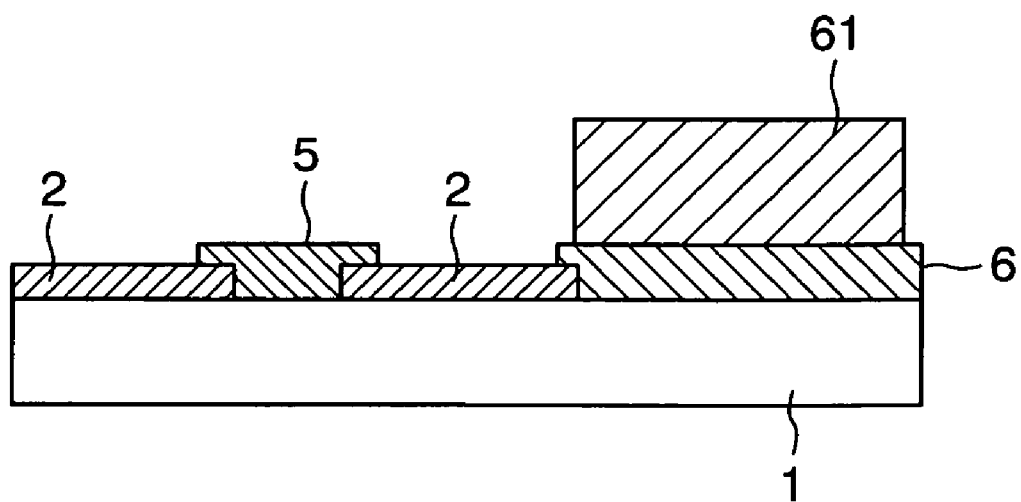
FIG. 11 is an enlarged cross-sectional view illustrating a part denoted as D in FIG. 10.

FIGS. 10 and 11 illustrate a relatively small chip of 5 mm one a side, each side being affixed with the polyimide sheet patterned as in FIG. 3, and FIG. 10 is an enlarged cross-section view of a part denoted as D in FIG. 10.

As can be clearly seen in FIGS. 10 and 11, with such a small chip, it is hard to fabricate the polyimide pattern so as to be in alignment with the aluminum electrode within the chip, and it is expected that only the circumference of such a small chip should be reinforced to solve the fragility problem with the chip.

Hence, unlike the cases as described in conjunction with FIGS. 4 and 5, a patterned segment 61 of the polyimide sheet is affixed to only the circumference of the chip, regardless of shapes and deployments of the aluminum electrodes 2 and the passivation film 5 within the device forming regions in the wafer 1.

As will be mentioned later, such polyimide sheet is useful to strengthen the wafer that is to undergo the thinning and the dicing so as to avoid cracking and chipping caused in the wafer.

The semiconductor chips resulted from the dicing are used to produce packaged devices where the polyimide sheet would remain. Since polyimide has properties of chemically stable, thermo resistant, and sufficiently hardness, no trouble will be expected by permanently residing it in the semiconductor device.

Although the polyimide sheet is suitable as a reinforcing insulator sheet and is used in the aforementioned embodiments, a sheet of any material that meets the requirements of hardness, thermo-resistibility, chemical stability, and the like may be an alternative to polyimide.

Figure 12:
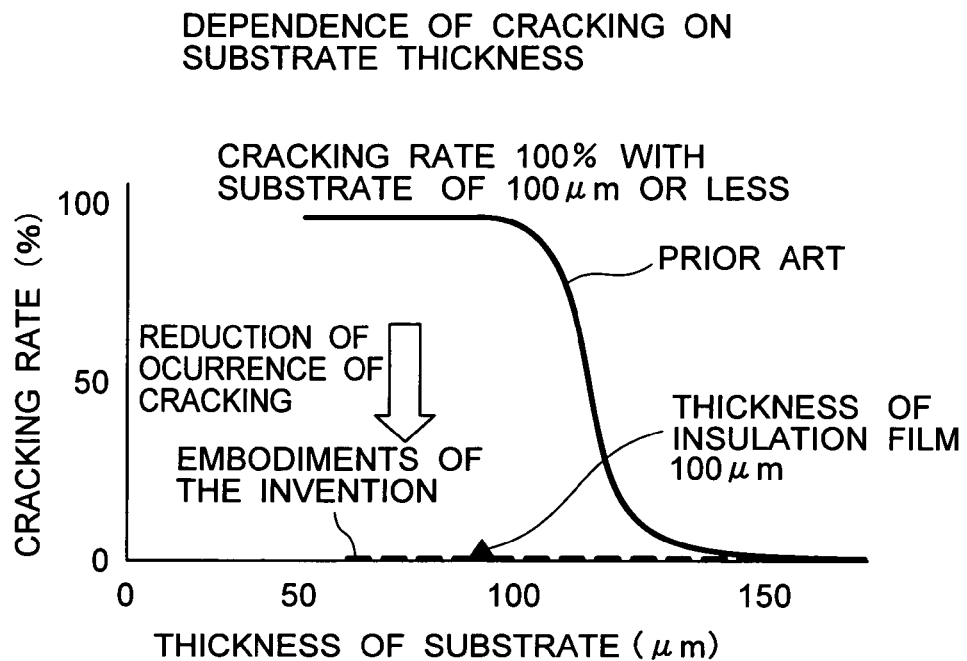
FIG. 12 is a graph showing a dependency of a substrate crack rate on a thickness of the substrate in the embodiment according to the present invention.
Figure 13:
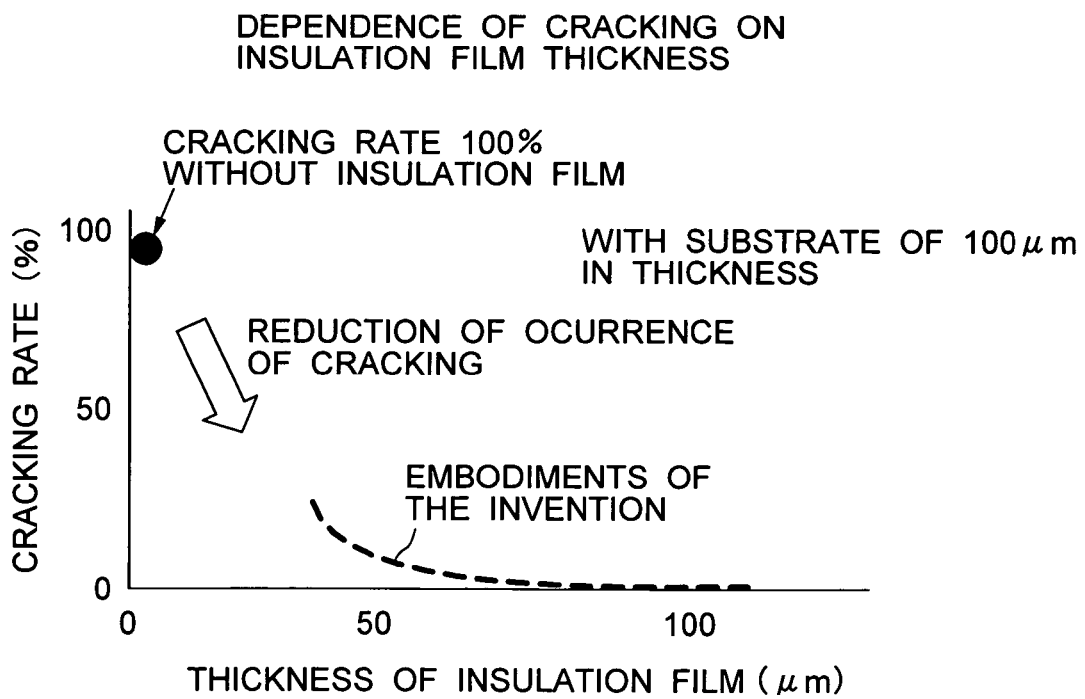
FIG. 13 is a graph showing a dependency of the substrate crack rate on a thickness of the insulator in the embodiment according to the present invention.

FIGS. 12 and 13 are charts illustrating improved effects of hardness in the embodiments according to the present invention.

FIG. 12 is a graph showing variations in crack rate relative to the varied thickness of the substrate to which the polyimide sheet of 100 micrometers in thickness is affixed to serve as an insulation film where the test results without the polyimide sheet are shown in solid line in comparison with those with the polyimide sheet as denoted by broken line. Without the polyimide sheet, it can be found in the chart that the crack rate reaches as high as 100 percent in the substrate of thickness less than 100 micrometers. In contrast, with the polyimide sheet, the crack rate is drastically reduced down to 0 percent in the substrate of down to approximately 50 micrometers in thickness.

On the other hand, FIG. 13 illustrates the test results under conditions that the substrate has a fixed thickness of 100 micrometers while only the insulation film is varied in thickness. As can be seen from the chart, the crack rate is 0 percent when the insulation film is 100 micrometers in thickness, and as the film thickness is diminished to 50 micrometers, the crack rate is maintained at 10 percent. Further reducing the thickness of the insulation film causes a rapid rise of the crack rate, and when the insulation film is thinned out to 0 micrometers, the crack rate rises to 100 percent.

The results tell us that the insulation film must be as thick as 50 micrometers or even higher.

Referring to FIG. 1 again, a metal film is deposited over the back surface of the thinned substrate, and thereafter, the substrate undergoes the thermal treatments. After being affixed to dicing tape, the wafer is cut into chips by a diamond blade during the dicing. The dicing is carried out through two-stage process where the polyimide sheet is separated at the first stage and succeedingly the semiconductor chips are separated at the second stage. Each of the semiconductor chips obtained in this manner still has the polyimide sheet in its upper surface.

After that, the semiconductor chip is used to produce a packaged device. The resultant semiconductor device has a configuration as detailed with reference to FIGS. 6 to 9.

It may be appropriately determined if the passivation film should be formed prior to the polyimide sheet is affixed to the wafer, depending upon the reliability of the product as desired. Especially, when the polyimide sheet patterned as in FIG. 2 is used, both the circumference of the device and the gaps defined between the adjacent electrodes are covered with the polyimide pattern, and hence, the absence of the passivation film would not degrade the reliability of product so much.

The optimum pattern of the polyimide sheet may be selected as required by the specifications of the intended semiconductor device since the workability and the process efficiency vary considerably during the elimination procedure from the sheet and the alignment procedure relative to the wafer, depending upon which part of the polyimide sheet should be removed, the part that is to be in alignment with the electrodes or in alignment with the device forming regions.

As have been described, in accordance with the embodiments of the present invention, there are provided a semiconductor device and a method of manufacturing the same where a wafer of reduced thickness can be used to fabricate products without cracking, a chipping, or warping.

What is claimed is:

1. A semiconductor device, comprising:
   a semiconductor substrate of 100 micrometers or less in thickness;
   an electrode pattern formed above the semiconductor substrate;
   an insulation film of 50 micrometers or greater in thickness residing on parts of the upper surface side of the semiconductor substrate other than on the electrode pattern and a device forming region; and
   a semiconductor element provided in the device forming region,
   wherein the semiconductor element includes a semiconductor layer of a first conductivity type provided at the upper part of the semiconductor substrate; a well region of a second conductivity type provided at an upper surface part of the semiconductor layer, the well contacting the semiconductor layer; first and second impurity diffused regions of the first conductivity type as source and drain regions provided in the well region; and a gate electrode provided at an interface area between the semiconductor layer, the well region and the first and second impurity diffused regions on a gate insulating film.

2. The semiconductor device according to claim 1, wherein an insulator passivation film is formed on the surface part of the semiconductor substrate between electrodes.

3. The semiconductor device according to claim 1, wherein the insulation film has a heat resistance of 400 degree centigrade or higher.

4. The semiconductor device according to claim 3, wherein the insulation film is polyimide film.

5. The semiconductor device according to claim 1, wherein a first segment of the insulation film provided on areas of the upper surface side other than the device forming region has greater width than the width of a second segment of the insulation film provided on areas of the upper surface side between electrodes within the device forming region.

6. The semiconductor device according to claim 1, wherein a lower part of the semiconductor substrate is of the second conductivity type to form a two-layer stacked structure.

7. The semiconductor device according to claim 6, wherein a high concentration first conductivity type region is provided between the upper part and the lower part to form a three-layer stacked structure.

8. A semiconductor device manufactured by a process comprising:
   forming elements on a semiconductor substrate by:
      preparing a semiconductor substrate having a semiconductor layer of a first conductivity type provided at an upper part of the semiconductor substrate;
      forming a well region of a second conductivity type at an upper surface part of the semiconductor layer, the well contacting the semiconductor layer;
      forming a gate electrode provided at an interface area between the semiconductor layer, the well region and first and second impurity diffused regions via a gate insulating film;
   forming electrodes in a predetermined part on the elements;
   affixing an insulator sheet of 50 micrometers or greater in thickness to the upper surface side of the semiconductor substrate, the insulator sheet being processed to remove some parts so as to be aligned with the electrodes or regions where the elements are provided,
   processing a back surface side of the semiconductor substrate affixed with the insulator sheet to form the semiconductor substrate of 100 micrometers or lower in thickness, and
   dicing the semiconductor substrate into semiconductor chips.

9. The semiconductor device according to claim 8, wherein said affixing the insulator sheet is performed by thermo-compression.

10. The semiconductor device according to claim 9, wherein the temperature range of the thermo-compression is 300 to 450 degree centigrade.

11. The semiconductor device according to claim 8, wherein the removal of parts of the insulator sheet is performed by punch-pressing.

12. The semiconductor device according to claim 8, wherein the removal of parts of the insulator sheet is performed by etching with organic alkaline liquid etchant.

13. The semiconductor device according to claim 8, wherein the removal of parts of the insulator sheet is performed by laser cutting.

14. The semiconductor device according to claim 8, wherein a semiconductor substrate is of the second conductivity type to form a two-layer stacked structure.

15. The semiconductor device according to claim 14, wherein a high concentration first conductivity type region is provided between the upper part and a lower part of the semiconductor substrate to form a three-layer stacked structure.

* * * * *